(12) United States Patent
Avanzino (10) Patent No.: US 7,465,408 B1
(45) Date of Patent: Dec. 16, 2008

(54) SOLUTIONS FOR CONTROLLED, SELECTIVE ETCHING OF COPPER

(75) Inventor: Steven C. Avanzino, Cupertino, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 966 days.

(21) Appl. No.: 10/726,992

(22) Filed: Dec. 3, 2003

(51) Int. Cl.
*B44C 1/22* (2006.01)
*C03C 15/00* (2006.01)
*C03C 25/68* (2006.01)
*C23F 1/00* (2006.01)
*C23F 3/00* (2006.01)

(52) U.S. Cl. .................. 216/100; 216/46; 252/79.1; 438/750; 438/751

(58) Field of Classification Search ............ 216/46, 216/100; 438/750, 751; 252/79.1
See application file for complete search history.

(56) References Cited

U.S. PATENT DOCUMENTS

| 5,098,533 A | 3/1992 | Duke et al. |
|---|---|---|
| 5,100,499 A | 3/1992 | Douglas |
| 5,279,702 A | 1/1994 | Douglas |
| 5,318,662 A | 6/1994 | Douglas |
| 5,336,363 A | 8/1994 | Morita |
| 5,968,847 A | 10/1999 | Ye et al. |
| 6,008,140 A | 12/1999 | Ye et al. |
| 6,010,603 A | 1/2000 | Ye et al. |
| 6,261,953 B1 * | 7/2001 | Uozumi ............... 438/687 |
| 6,355,979 B2 | 3/2002 | Tesauro et al. |
| 6,488,862 B1 | 12/2002 | Ye et al. |
| 6,489,247 B1 | 12/2002 | Ye et al. |
| 6,547,843 B2 * | 4/2003 | Shimazu et al. ............ 51/309 |
| 6,589,882 B2 | 7/2003 | Andreas et al. |
| 6,594,024 B1 * | 7/2003 | Singh et al. ............... 356/630 |
| 6,596,638 B1 * | 7/2003 | Kondo et al. ............. 438/690 |
| 6,719,920 B2 * | 4/2004 | Miller ..................... 252/79.1 |

* cited by examiner

*Primary Examiner*—Binh X Tran
*Assistant Examiner*—Mahmoud Dahimene
(74) *Attorney, Agent, or Firm*—Amin, Turocy & Calvin, LLP

(57) ABSTRACT

Disclosed are methods and systems of etching copper containing materials so that they have smooth and/or planar surface. In this connection, the systems and methods employ two different solutions to accomplish the etching. The first solution oxidizes the surface of the copper containing material and forms a passivating film. The second solution removes the passivating film in a controlable manner.

20 Claims, 6 Drawing Sheets

SOLUTIONS FOR CONTROLLED, SELECTIVE ETCHING OF COPPER

TECHNICAL FIELD

The present invention generally relates to etching copper in a controlled and selective manner. In particular, the present invention relates to using two solutions to wet etch copper containing materials so that the result surface is smooth and/or planarized.

BACKGROUND ART

In many of the present day semiconductor devices, aluminum is commonly used for interconnect lines and contacts. Aluminum offers a number of advantages in ease of fabrication. Nevertheless, when the aluminum wire size is decreased to smaller than 0.5 μm, concerns over electromigration resistance and the stress migration resistance of aluminum increase. In addition, when the feature size of an aluminum-based contact requires an aspect ratio of greater than 1:1, it is difficult to obtain planarization of the substrate during the application of the next insulating layer over the contact area of the substrate. As demands on transistor gate velocity and interconnect line transmission time increase, copper is becoming the material of choice for the next generation of interconnect lines and contacts. After all, the resistivity of copper is about 1.4 μΩ/cm, which is only about half of the resistivity of aluminum. Generally speaking, copper exhibits low corrosion, low electromigration and high conductivity. However, copper is not easily integrated into integrated circuit fabrication process flows.

For example, CMP techniques used to remove excess copper from the dielectric surface after deposition create problems. Copper is a soft material which can smear across the underlying surface during polishing. Dishing of the copper surface may occur during polishing due to deformation of the polishing pad into wide features. As a result of dishing, there is variation in the critical dimensions of conductive features. Moreover, particles from the slurry used during the CMP process may become bonded to the surface of the copper and other materials surrounding the location of the copper lines and contacts. The chemicals present in the slurry may corrode the copper, leading to increased resistivity and possibly even corrosion through an entire wire line thickness.

Although copper can be etched in a variety of ways, concerns are present. Copper may be plasma etched using a chlorine based etch chemistry at highly elevated temperatures. Ion milling or magnetron etching with argon or chlorine reagents may also be used. However, the use of halogens is disfavored for many reasons. Wet chemical etching of copper is also known, such as using HCl. When wet etch processes are employed, there is difficulty in controlling the etch profile of the features, as well as the etch rate. In particular, when the thickness of the copper layer being etched is comparable to the minimum pattern dimension, undercutting due to isotropic etching becomes a greater concern. In addition, there is extreme corrosion of the copper during the wet etch process itself. Wet etching often leaves the copper surface undesirably rough and pitted, complicating further processing.

Other concerns in utilizing copper in semiconductor processing applications involve difficulties in cleaning the copper. For instance, an electrical connection with other conductive components is often made to copper. Formation of such electrical connection frequently involves providing a conductive material over the surface of the copper. However, if the surface of the copper is partially or entirely covered with debris, the physical connection of the conductive material and the copper surface can be impaired. Such impairment can lead to attenuation of electrical current passing between the copper and the conductive material formed thereover.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides systems and methods for etching copper containing materials so that they have smooth and/or planar surface. In this connection, the systems and methods employ two different solutions to accomplish the etching. The first solution oxidizes the surface of the copper containing material and forms a passivating film. The second solution removes the passivating film in a controlable manner.

One aspect of the present invention relates to a method of etching a copper containing material involving contacting the copper containing material with a first solution to convert at least a portion of the copper containing material to a passivating film, the first solution containing at least a peroxide compound, a first organic acid, and water; and contacting the passivating film with a second solution to remove the passivating film, the second solution containing at least a second organic acid and water.

Another aspect of the present invention relates to simultaneously with one or both of contacting the copper containing material with a first solution and contacting the passivating film with a second solution monitoring the formation and/or removal of the passivation layer using a monitoring system, such as an interferometry system or a scatterometry system by generating a signature associated with forming and removing the layer, comparing the signature to a signature library to determine layer depth, and terminating forming and removing the passivation layer when a desired depth is attained.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The copper structures that are etched in accordance with the present invention contain copper and may have any shape. For example, the copper structure may be a layer, occupy a via (including occupy the via and associated overfill adjacent and/or nearby the via), occupy a trench (including occupy the trench and associated overfill adjacent and/or nearby the trench), lines, mesa structures, step structures, occupy a dual damascene opening (including occupy the dual damascene and associated overfill adjacent and/or nearby the dual damascene), and the like.

The copper structures contain at least about 10% by weight copper. Other materials that may be present in the copper structures include other metals, metal oxides, metal nitrides, metal silicides, and the like. In another embodiment, the copper structures contain at least about 25% by weight copper. In yet another embodiment, the copper structures contain at least about 50% by weight copper. Examples of copper structure materials include copper, brass, bronze, copper aluminum alloys, copper gold alloys, copper silver alloys, copper platinum alloys, copper palladium alloys, and the like.

Copper structures are etched by contacting the copper structures with two different solutions in succession. The first solution, when in contact with the copper structure, causes the formation of a passivating film or passivation layer on/within the copper structure. The second solution then removes the newly formed passivation layer, but not substantially any copper, from the remaining portion of the copper structure thereby etching the copper structure. Since the amount of passivation can be controlled, the amount of copper etching is correspondingly controlled.

The first solution is contacted with the copper structure and leads to the formation of the passivation layer on/within the copper structure. That is, a portion of the copper structure is converted to a passivation layer, and/or the passivation layer may assume more volume than the copper structure which is converted to the passivation layer. The newly formed passivation layer is positioned adjacent the remaining portions of the copper structure. The passivation layer contains at least copper oxide. Passivating films are used to protect the portion of the copper structure which is not to be etched during the etch processing of the present invention. Such passivating films are generally used to protect the copper structure from contamination or reactions with incident reactive species during the etch processing of the present invention.

The time that the first solution is in contact with the copper structure may vary depending upon the amount of the copper structure one desires to etch/remove. Generally, the longer that the first solution is in contact with the copper structure, the thicker the passivation layer becomes, and depth into the copper structure to which etching takes place increases. In one embodiment, the time that the first solution is in contact with the copper structure is from about 1 second to about 200 minutes. In another embodiment, the time that the first solution is in contact with the copper structure is from about 5 seconds to about 20 minutes.

The temperature of the first solution is maintained to facilitate the formation of the passivation layer on/within the copper structure. The temperature may also be varied to control, in part, the rate at which the passivation layer is formed. In one embodiment, the temperature of the first solution during contact with the wafer having a copper structure thereon is from about 5° C. to about 50° C. In another embodiment, the temperature of the first solution is from about 10° C. to about 45° C. In another embodiment, the temperature of the first solution is from about 15° C. to about 40° C.

The pH of the first solution must be maintained at about 6.5 or lower in order to facilitate formation of the passivation layer on/within the copper structure. In one embodiment, the pH of the first solution is from about 2 to about 6.5. In another embodiment, the pH of the first solution is from about 2.5 to about 6. In yet another embodiment, the pH of the first solution is from about 3 to about 5.5.

The first solution contains at least one peroxide compound. Peroxide compounds have a divalent —O—O— structure within their molecule. Generally speaking, peroxide compounds are strong oxidizers. As such, the peroxide compound contributes to the formation of the passivation layer on/within the copper structure. Examples of peroxide compounds include barium peroxide, benzoyl peroxide, carbamide peroxide, cumene hydroperoxide, di-t-butyl peroxide, hydrogen peroxide, potassium peroxide, and sodium peroxide.

In one embodiment, the first solution contains from about 1% to about 50% by weight of at least one peroxide compound. In another embodiment, the first solution contains from about 2% to about 40% by weight of at least one peroxide compound. In yet another embodiment, the first solution contains from about 3% to about 30% by weight of at least one peroxide compound. In still yet another embodiment, the first solution contains from about 5% to about 20% by weight of at least one peroxide compound.

The first solution contains at least one organic acid. The organic acid contributes to the formation of the passivation layer on/within the copper structure. Organic acids are generally represented by the formula R—$CO_2$H, where R is hydrogen or an organic moiety including up to about 20 carbon atoms. In another embodiment, R is hydrogen or an organic group containing up to about 10 carbon atoms. R may contain additional acid moieties, alcohol groups, nitro groups, sulfur groups, alkyl groups, alkene groups, aromatic groups, heterocyclic groups, and so on.

Examples of organic acids include carboxylic acids and polycarboxylic acids such as alkanoic acids, including formic acid, acetic acid, propionic acid, butyric acid, pentanoic acid, hexanoic acid, heptanoic acid, octanoic acid, and so on, dichloroacetic acid, trichloroacetic acid, trifluoroacetic acid, perfluoroacetic acid, perfluorooctanoic acid, (generally containing 1 to about 20 carbon atoms); polycarboxylic acids (dicarboxylic acids, tricarboxylic acids, etc.), such as oxalic acid, malonic acid, succinic acid, fumaric acid, glutaric acid, itaconic acid, ethylenediaminetetraacetic acid, and so on (generally containing 1 to about 12 carbon atoms); hydroxyalkanoic acids, such as citric acid, ascorbic acid, maleic acid, malic acid, and so on (generally containing 1 to about 10 carbon atoms); organic phosphorus acids such as dimethylphosphoric acid and dimethylphosphinic acid; sulfonic acids such as alkylsulfonic acids (containing 1 to about 20 carbon atoms) including methanesulfonic acid, trifluoromethanesulfonic acid, ethanesulfonic acid, 1-pentanesulfonic acid, 1-hexanesulfonic acid, and 1-heptanesulfonic acid; aromatic sulfonic acids such as benzenesulfonic acid, benzenedisulfonic acid, tolulenesulfonic acid, and naphthalenesulfonic acid; tropolone; benzoic acid; picric acid; etc.

In one embodiment, the first solution contains from about 0.001% to about 10% by weight of at least one organic acid. In another embodiment, the first solution contains from about 0.01% to about 5% by weight of at least one organic acid. In yet another embodiment, the first solution contains from about 0.05% to about 3% by weight of at least one organic acid.

The first solution contains water. Preferably, deionized and/or degassed water is employed. In one embodiment, the first solution contains from about 30% to about 98% by weight of water. In another embodiment, the first solution contains from about 40% to about 95% by weight of water. In yet another embodiment, the first solution contains from about 50% to about 90% by weight of water.

Optionally, the first solution contains pH adjuster, particularly if fine tuning of the pH is required. Since the first solution has an acidic pH, the organic acid is used to lower the pH. However, to raise the pH, a base compound can be employed, and constitutes the pH adjuster. Base compounds include organic amines, alkali metal hydroxides, alkaline earth metal hydroxides, ammonium hydroxides, tetraalkylammonium hydroxides, alkali metal carbonates and bicarbonates, alkaline earth metal carbonates and bicarbonates, ammonium carbonates and bicarbonates, tetraalkylammonium carbonates and bicarbonates, alkali metal borates, ammonium borates, tetratalkylammonium borates, alkali metal dihydrogen-phosphates, alkaline earth metal dihydrogen-phosphates, ammonium dihydrogen-phosphates, tetraalkylammonium dihydrogen-phosphates, alkali metal silicates, alkaline earth metal silicates, ammonium silicates, tetraalkylammonium silicates, and the like.

In one embodiment, when present, the first solution contains from about 0.001% to about 5% by weight of at least one base compound. In another embodiment, when present, the first solution contains from about 0.01% to about 1% by weight of at least one base compound.

Optionally, the first solution contains at least one surfactant. Surfactants include nonionic, cationic, anionic, and amphoteric surfactants. Nonionic surfactants are preferred. Examples of surfactants include water soluble polymer surfactants, block polymers, alkoxylated glycols, aliphatic polyethers, and the like. These surfactants are known in the art, and many of these surfactants are described in McCutcheon's "Volume I: Emulsifiers and Detergents", 2001, North American Edition, published by Manufacturing Confectioner Publishing Co., Glen Rock, N.J., and in particular, pp. 1-233 which describes a number of surfactants and is hereby incorporated by reference for the disclosure in this regard.

Examples include those under the trade designations TETRONIC®, PLURONIC® and PLURONIC®R available from BASF Corporation and specifically product designations L10, N3, L31, L35, F38, L43, L44, L61, L62, L64, L65, F68, F77, L81, P84, P85, F87, F88, L92, F98, L10, P103, P104, P105, F108, L121, L123, F127, 10R5, 17R2, 17R4, 25R2, 25R4, 31R1, L44NF, F68NF, F87NF, F108NF, and F127NF; those under the trade designation ANTAROX® available from Rhodia Inc.; those under the trade designation SURFONIC® available from Huntsman Corp.; those under the trade designations TERGITOL™ and TRITON™ available from Dow Chemical Co.; those under the trade designation DELONIC available from DeForest Enterprises Inc.; and the like. Specific examples include ethylene oxide and propylene oxide copolymers; ethoxylated fatty acids, alcohols, or alkyl phenols; propoxylated fatty acids, alcohols, or alkyl phenols; octylphenoxy polyethoxy ethanol; castor oil ethoxylate; isodecyl alcohol ethoxylate; ethoxylated nonylphenol; and the like.

In one embodiment, when present, the first solution contains from about 0.01% to about 20% by weight of at least one surfactant. In another embodiment, when present, the first solution contains from about 0.1% to about 15% by weight of at least one surfactant. In yet another embodiment, when present, the first solution contains from about 0.5% to about 10% by weight of at least one surfactant.

Optionally, the first solution contains at least one ionic salt. The ionic salt facilitates increasing and/or adjusting the ionic strength of the solution. General examples of ionic salts include metal and non-metallic salts. Specific examples include alkali metal sulfates, alkaline earth metal sulfates, ammonium sulfate, alkylammonium sulfates, alkali metal nitrates, alkaline earth metal nitrates, ammonium nitrate, alkylammonium nitrates, alkali metal chlorides, alkaline earth metal chlorides, ammonium chloride, alkylammonium chlorides, and the like.

In one embodiment, when present, the first solution contains from about 0.01% to about 20% by weight of at least one ionic salt. In another embodiment, when present, the first solution contains from about 0.1% to about 15% by weight of at least one ionic salt. In yet another embodiment, when present, the first solution contains from about 1% to about 10% by weight of at least one ionic salt.

The second solution is contacted with the passivation layer on/within the copper structure. The second solution dissolves the passivation layer and removes the passivation layer from the remaining copper structure. The second solution has high selectivity for the passivation layer as substantially none of the remaining portions of the copper structure are removed. In one embodiment, selectivity between the passivation layer and the remaining copper structure is about 7:1 or higher. In another embodiment, selectivity between the passivation layer and the remaining copper structure is about 10:1 or higher. Due to the high selectivity, the second solution may be contacted with the copper structure a second time for cleaning purposes, since the danger of deleteriously removing the remaining portions of the copper structure is not present. Moreover, the second solution does not substantially dissolve or remove barrier materials to copper structures (such as Ta, TaN, Ti, TiN, and the like).

The time that the second solution is in contact with the copper structure may vary depending upon the thickness/volume of the passivation layer formed by the first solution. Generally, the thicker the passivation layer, the longer that the second solution is in contact with the passivation layer and the copper structure. In one embodiment, the time that the second solution is in contact with the copper structure is from about 1 second to about 200 minutes. In another embodiment, the time that the second solution is in contact with the copper structure is from about 5 seconds to about 20 minutes.

The temperature of the second solution is maintained to facilitate the dissolution and removal of the passivation layer on/within the copper structure. The temperature may also be varied to control, in part, the rate at which the passivation layer is removed. In one embodiment, the temperature of the second solution during contact with the wafer having a passivation layer on/within copper structure thereon is from about 20° C. to about 90° C. In another embodiment, the temperature of the second solution is from about 25° C. to about 80° C. In yet another embodiment, the temperature of the second solution is from about 30° C. to about 70° C. In still yet another embodiment, the temperature of the second solution is higher than the temperature of the first solution used to form the passivation layer.

The pH of the second solution must be maintained at about 6 or lower in order to facilitate dissolution and removal of the passivation layer on/within the copper structure. In one embodiment, the pH of the second solution is from about 1 to about 6. In another embodiment, the pH of the second solution is from about 1.5 to about 5.5. In yet another embodiment, the pH of the second solution is from about 2 to about 5.

The second solution contains at least one organic acid. The organic acid facilitates dissolving and removal of the passivation layer from the remaining portions of the copper structure. The organic acid of the second solution can be any of the organic acids described above in connection with the first solution (and are not repeated here for brevity).

In one embodiment, the second solution has a lower pH and/or higher amount of organic acid than the first solution. In another embodiment, the second solution contains at least two organic acids. The second solution may contain the same acid(s) as the first solution, or the second solution may contain different acid(s) from the first solution.

In one embodiment, the second solution contains from about 0.001% to about 10% by weight of at least one organic acid. In another embodiment, the second solution contains from about 0.01% to about 5% by weight of at least one organic acid. In yet another embodiment, the second solution contains from about 0.1% to about 3% by weight of at least one organic acid.

The second solution contains water. Preferably, deionized and/or degassed water is employed. In one embodiment, the second solution contains from about 50% to about 99.9% by weight of water. In another embodiment, the second solution contains from about 70% to about 99.5% by weight of water. In yet another embodiment, the second solution contains from about 80% to about 99% by weight of water.

Optionally, the second solution contains a surfactant. The second solution may contain the surfactants in the amounts as described above in connection with the first solution (and are not repeated here for brevity). Optionally, the second solution contains a pH adjuster. The second solution may contain the pH adjusters in the amounts as described above in connection with the first solution (again, not repeated here for brevity).

Optionally, the second solution contains a biocide. Examples include those under the trade designations KATHON™ and NEOLONE™ available from Rohm & Haas and specifically product designations KATHON™ CG, KATHON™ CG II, and NEOLONE™ 950; those under the trade designation CLEANBIO™ available from Kolon Industries; those under the trade designation PROXEL available from Avecia Inc.; those under the trade designation STABROM available from Albemarle Corporation; and the like. Specific examples of biocides include of isothiazolines; isothiazolinones, such as methylisothiazolinone and methylchloroisothiazolinone; chlorine; chlorine dioxide; BCDMH (3-bromo-1-chloro-5,5-dimethylhydantoin); glutaraldehyde; DBNPA (2,2-dibromo-3-nitrilopropionamide); and the like.

In one embodiment, the second solution contains from about 0.001% to about 5% by weight of a biocide. In another embodiment, the second solution contains from about 0.01% to about 2% by weight of a biocide.

When treating the copper structure in accordance with the present invention, the first solution is contacted with the wafer containing the copper structure, and afterwards the second solution is contacted with the wafer containing the copper structure. Several optional acts may precede, interject, and/or follow the two solution etching treatment. For example, the wafer may be prerinsed/wetted, for instance with water or a wetting liquid, prior to contact with the first solution. Such a pretreatment may removes debris and/or wet the copper structure surface thereby increasing the effectiveness of the first solution in forming the passivation layer. After contact with the first solution and before contact with the second solution, the wafer may be rinsed, for instance with water or a neutralization liquid, to facilitate removal of the peroxide compound and organic acid from the wafer. Finally, after contact with the second solution, the wafer may be rinsed, for instance with water, a cleaner, or a neutralization liquid, to facilitate removal of the organic acid from the wafer.

In some instances, it may be necessary to repeat the two solution etching process until the desired amount of the copper structure is removed from the wafer. The two solution process may be repeated two or more times, three or more times, four or more times, etc.

The resultant copper structure surface has one or more of smooth, planar, level, substantially pit free, and lusterous. Due to the high degree of control associated with the two solution process, a precise amount of the copper structure is etched. Also due to the high degree of control associated with the two solution process, consistent precise amounts can be removed from similar copper structures on different wafers on a wafer to wafer basis, improving batch to batch uniformity.

When it is desired to etch only a small amount of material from the copper structure, the high degree of control is advantageous. For example, when copper in a via or trench is etched in an attempt to form a recessed step within the via or trench using the two solution process of the present invention, uniform etching is achieved. That is, a planar, level step within the via or trench can be formed. In one embodiment, the two solution process of the present invention can be employed to precisely and accurately remove 150 Å or less material from a copper structure.

The two solution copper etching process of the present invention provides a relatively smooth, substantially pit-free copper surface. Surface roughness/smoothness can be quantified by $R_{tm}$. $R_{tm}$ is the mean of the maximum peak-to-valley vertical measurement from each of five consecutive sampling measurements, and can be measured using known techniques including using one of an atomic force microscope and a scanning electron microscope. A rough surface is characterized by a "mountainous" features (numerous peaks and valleys) and/or dendritic features. A smooth surface is planar and/or wavy.

In one embodiment, the relatively smooth copper structure surface has an $R_{tm}$ of about 50 Å or less. In another embodiment, the relatively smooth copper structure surface has an $R_{tm}$ of about 40 Å or less. In yet another embodiment, the relatively smooth copper structure surface has an $R_{tm}$ of about 30 Å or less. In still yet another embodiment, the relatively smooth copper structure surface has an $R_{tm}$ of about 20 Å or less.

Figure 1:
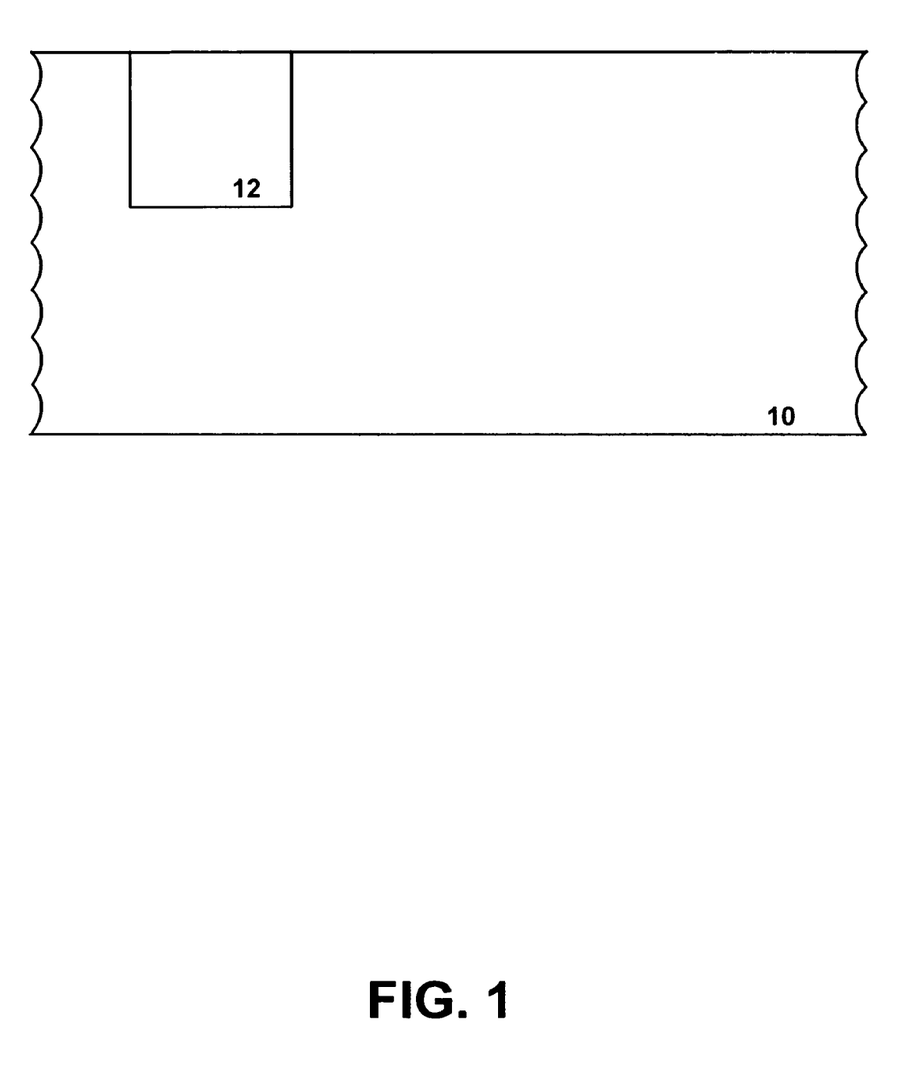
FIG. 1 illustrates a cross sectional view of the two solution process according to one aspect of the present invention.
Figure 2:
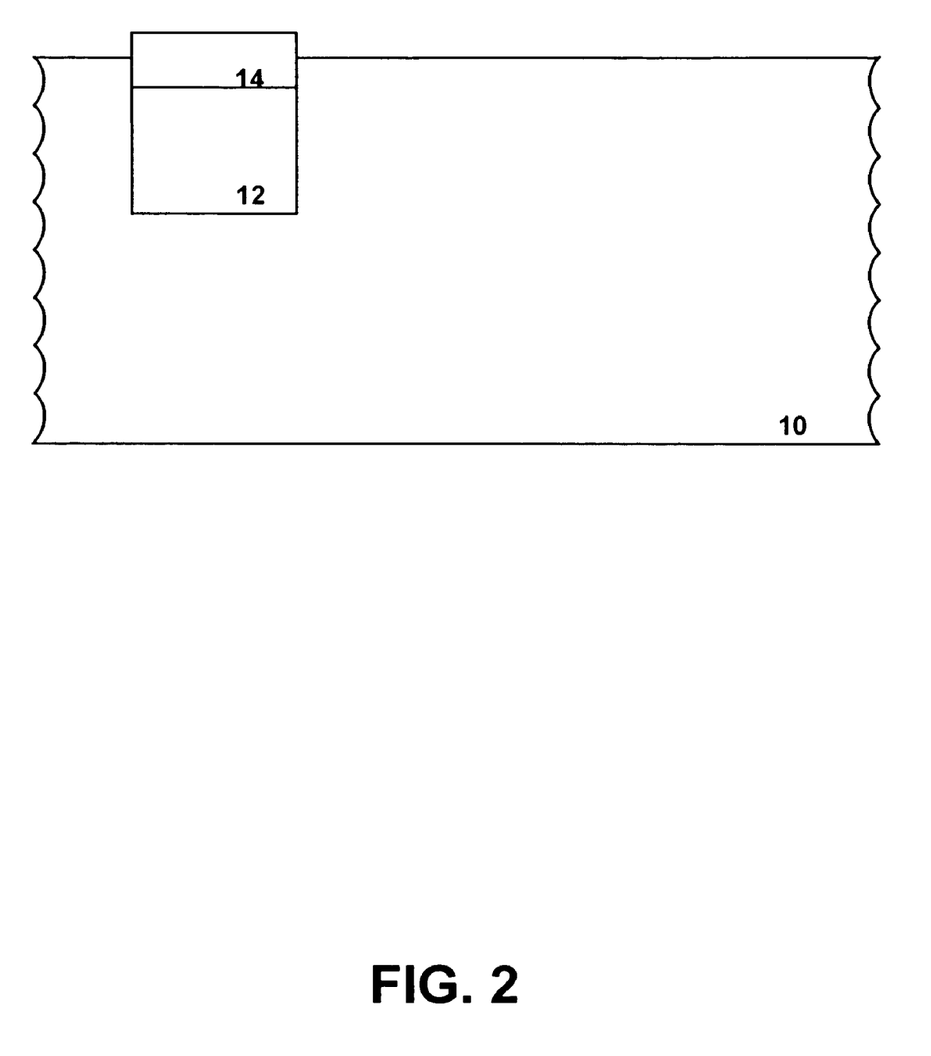
FIG. 2 illustrates a cross sectional view of the two solution process according to another aspect of the present invention.
Figure 3:
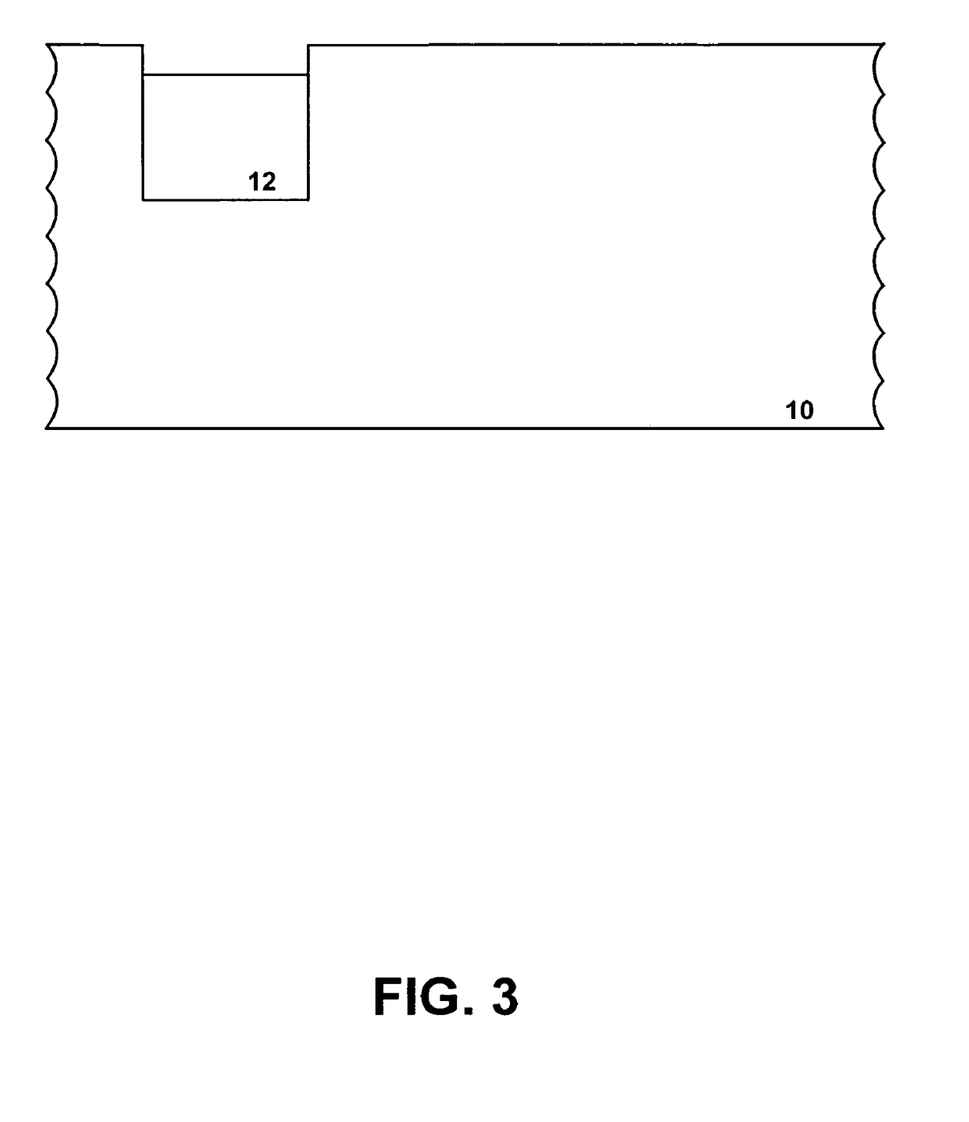
FIG. 3 illustrates a cross sectional view of the two solution process according to yet another aspect of the present invention.

Referring to FIGS. 1 to 3, one aspect of the method of etching a copper structure using a two solution process is illustrated. Specifically referring to FIG. 1, a wafer 10 with a copper structure 12 therein is provided.

Referring to FIG. 2, a first solution containing a peroxide compound, an organic acid, and water is contacted with the wafer 10. Consequently, a portion of the copper structure 12 is converted to passivation layer 14.

Referring to FIG. 3, a second solution containing an organic acid and water is contacted with the wafer, the second solution dissolving and removing the passivation layer 14 from the copper structure 12. As a result, the copper structure is etched using two solutions.

Figure 4:
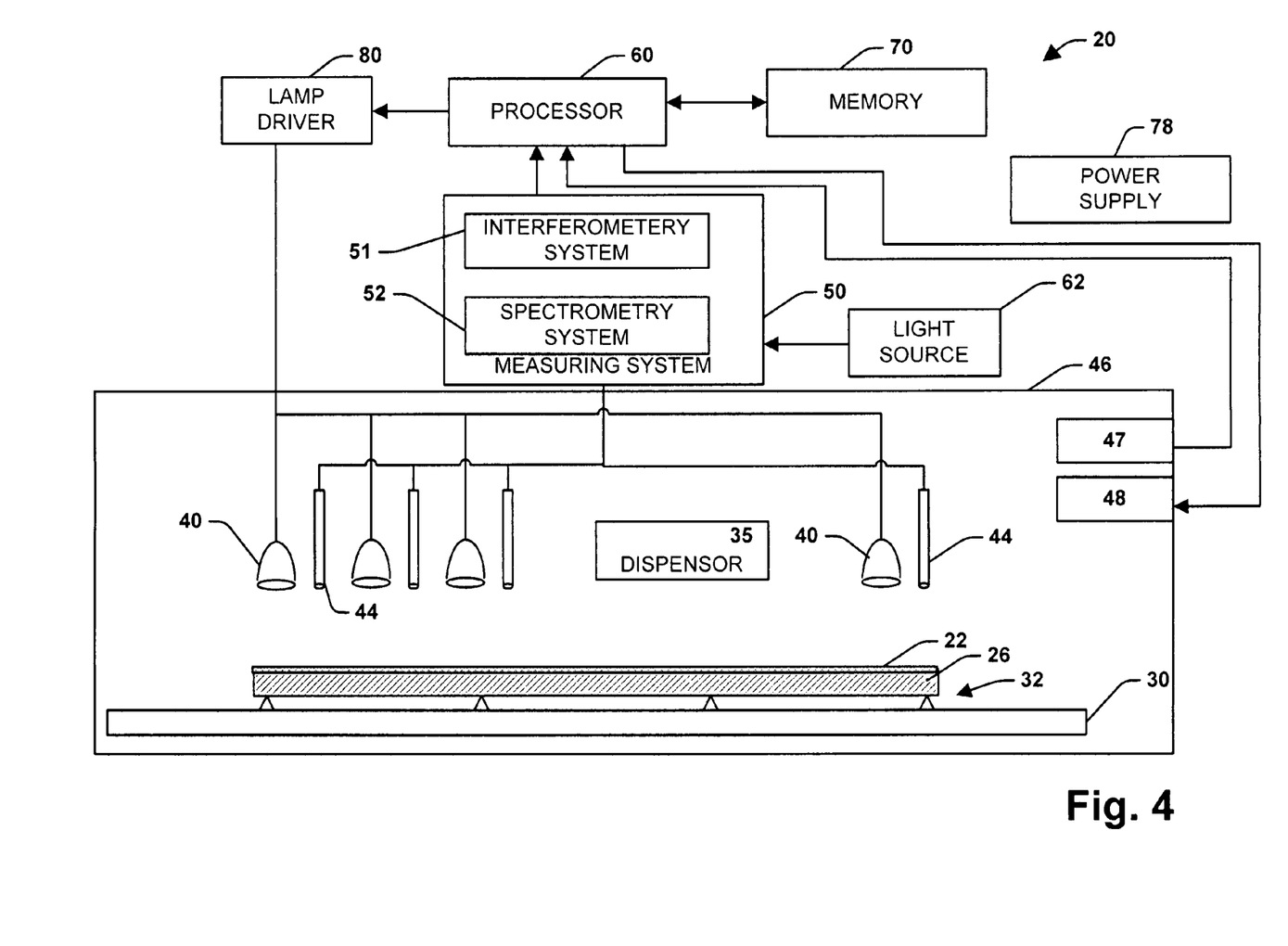
FIG. 4 is schematic block diagram of a system for etching a copper structure in accordance with one aspect of the present invention.
Figure 5:
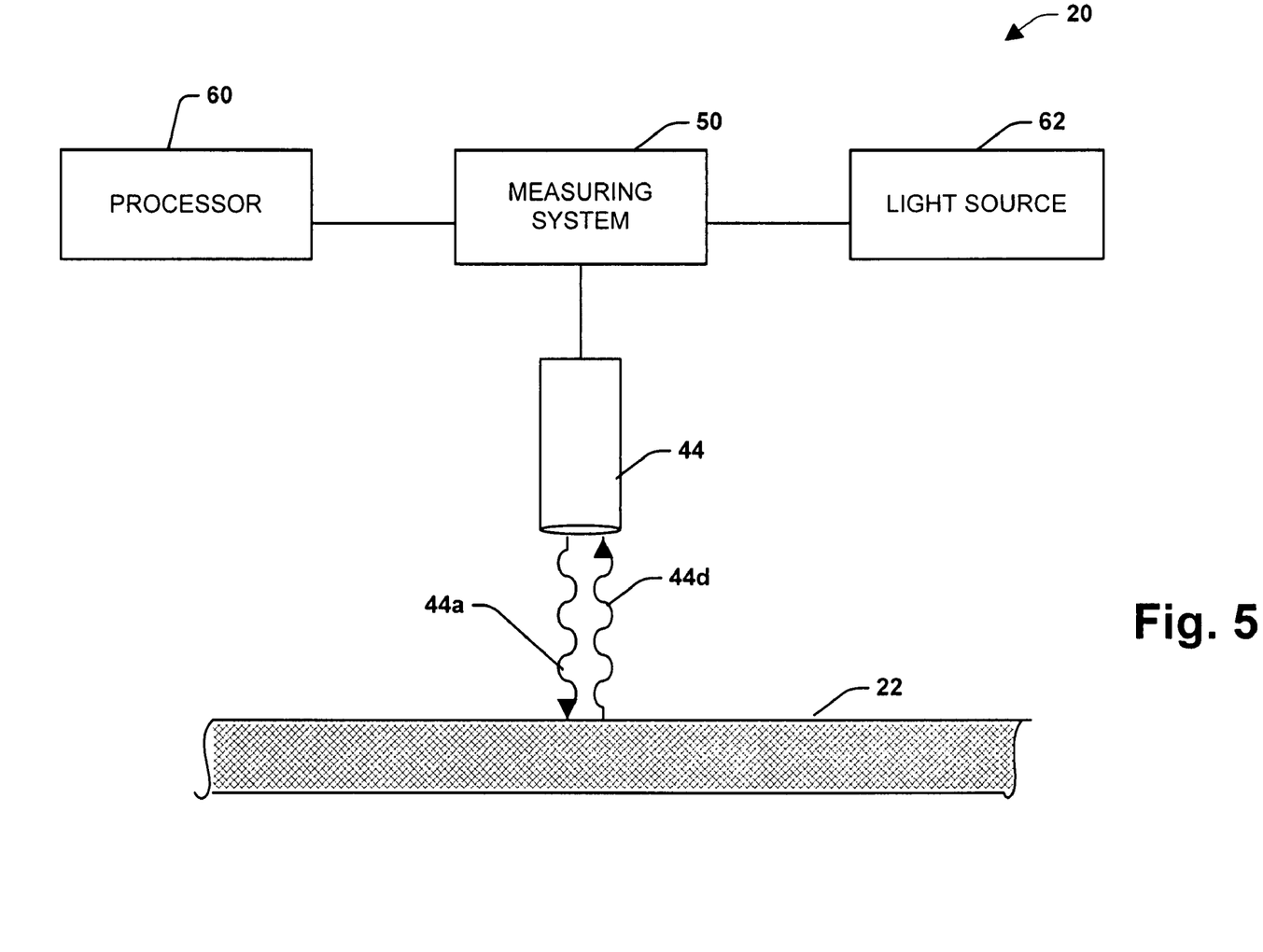
FIG. 5 is a partial schematic block diagram of the system of FIG. 4 being employed in connection with determining passivation film depth by measuring absorptivity in accordance with one aspect of the present invention.
Figure 6:
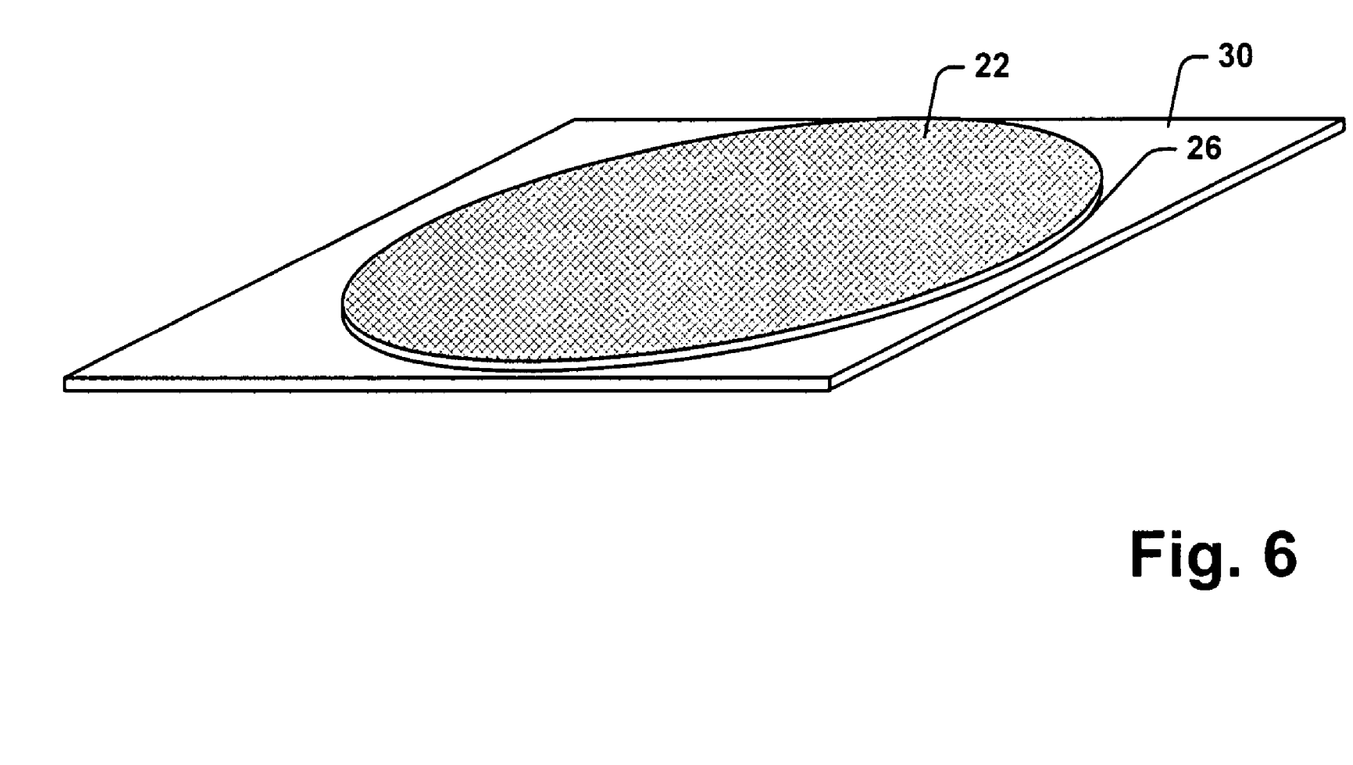
FIG. 6 is a perspective illustration of a top side of a plate, and a substrate having a copper structure in accordance with one aspect of the present invention.

Systems and related methods for etching a copper structure using two solutions are described in FIGS. 4 to 6. Referring to FIG. 4, a system 20 for etching a copper structure 22 is shown. For convenience, copper structure 22 is shown, but it is to be understood that the system and method must be implemented as copper structure 22 is in fact etched. The substrate 26 is supported over a baking plate 30 by a plurality of proximity pins 32 which prevent contact between the substrate 26 and plate 30. The proximity pins 32 elevate the substrate 26 about 1 mm above the surface of the plate 30. Preventing contact of the substrate 26 with the plate 30 mitigates contamination of the substrate 26 with particles from the plate 30. However, it is to be appreciated that the scope of the present invention is intended to cover systems where the substrate is in contact with the plate. The system contains dispenser 35 for contacting the first solution and the second solution with the substrate 26.

The system 20 further includes a plurality of heaters 40 which are selectively controlled by the system 20 so as to facilitate heating. A plurality of optical fibers 44 project radiation onto respective portions of the copper structure 22. Radiation reflected from the copper structure 22 is processed by a parameter measuring system 50 to measure at least one of the height of the copper structure 22, the height of the passivation layer, the temperature, the pH, the concentrations of components in the two solutions, and the like, within the chamber 46. The reflected radiation is processed with respect to the incident radiation in measuring the parameters.

The measuring system 50 includes an interferometry system 51 (or a scatterometry system) and a spectrometry system 52. It is to be appreciated that any suitable interferometry system, scatterometry system, and/or spectrometry system may be employed to carry out the present invention and such systems are intended to fall within the scope of the hereto appended claims. Interferometry systems, scatterometry systems, and spectrometry systems are well known in the art, and therefore further discussion related thereto is omitted for sake of brevity.

A source 62 of monochromatic radiation such as a laser provides radiation to the plurality of optical fibers 44 via the measuring system 50. Preferably, the radiation source 62 is a frequency stabilized laser however it is to be appreciated that any laser or other radiation source suitable for carrying out the present invention may be employed.

A processor 60 receives the measured data from the measuring system 50 and determines the parameters of respective portions of the copper structure 22. The processor 60 is operatively coupled to system 50 and is programmed to control and operate the various components within the system 20 in order to carry out the various functions described herein. The processor or CPU 60 may be any of a plurality of processors. The manner in which the processor 60 can be programmed to carry out the functions relating to the present invention are readily apparent to those having ordinary skill in the art based on the description provided herein.

A memory 70 which is operatively coupled to the processor 60 is also included in the system 20 and serves to store program code executed by the processor 60 for carrying out operating functions of the system 20 as described herein. The memory 70 includes read only memory (ROM) and random access memory (RAM). The ROM contains among other code the Basic Input-Output System (BIOS) which controls the basic hardware operations of the system 20. The RAM is the main memory into which the operating system and application programs are loaded. The memory 70 also serves as a storage medium for temporarily storing information such as first and second solution temperature, temperature tables, copper structure heights, pH, substrate coordinate tables, interferometry information, spectrometry information, passivation height data, optional component concentrations, organic acid identity, time of contact, and other data which may be employed in carrying out the present invention. For mass data storage, the memory 70 may include a hard disk drive.

The processor 60 is also coupled to a driving system 80 which drives the heaters 40. The driving system 80 is controlled by the processor 60 so as to selectively vary heat output of the respective heaters 40. Each respective portion of the copper structure 22 has a corresponding heater 40 and optical fiber 44 associated therewith. The processor 60 is able to monitor the temperature of the various copper structure portions and selectively regulate the temperatures of each portion via the corresponding heaters 40. As a result, the system 20 provides for regulating heating temperature of the copper structure 22 with substantial uniformity. In another embodiment that does not employ heaters 40 as the heating element, as the first and second solutions may be dispensed at desired temperatures.

A pH measuring system includes pH sensor 47 and pH regulator 48. It is to be appreciated that any suitable pH measuring system may be employed to carry out the present invention and such systems are intended to fall within the scope of the hereto appended claims. pH measuring systems are well known in the art, and therefore further discussion related thereto is omitted for sake of brevity.

The processor 60 also receives the measured data from the pH measuring system (the pH sensor 47 in particular) and determines the pH of the first or second solutions. The processor 60 is operatively coupled to the pH sensor 47 and pH regulator 48 and is programmed to control and operate the various components within the system 20 in order to carry out the various functions described herein. The memory 70 also serves as a storage medium for temporarily storing information such as pH, peroxide concentration, acid content data, temperature-pH inter-relationship data, and other data which may be employed in carrying out the present invention.

The processor 60 is coupled to the pH regulator 48 which maintains, raises, or lowers the pH of the first or second solutions. The pH measuring system is controlled by the processor 60 so as to selectively vary the pH. The processor 60 is able to monitor the pH of the first or second solutions and maintain, raise, or lower the pH via the pH regulator 48. As a result, the system 20 provides for regulating pH, which in turn improves the formation of the passivation layer and etching of the copper structure 22.

Power supply 78 provides operating power to the system 20. Any suitable power supply (e.g., battery, line power) may be employed to carry out the present invention.

One parameter that may be measured by the system 20 is absorptivity of the copper structure 22 as shown in FIG. 5. The absorption of the incident radiation 44a by the copper structure 22 corresponds to the parameters of the copper structure 22. Accordingly, the phase and/or intensity of reflected radiation 44d will be indicative of the absorptivity of the copper structure 22 which in turn is indicative of certain process parameters. The measuring system 50 collects the reflected radiation 44d and processes the reflected radiation 44d in accordance with interferometry and/or spectrometry techniques to provide the processor 60 with data corresponding to the absorptivity of the copper structure 22. The processor 60 analyzes the data and determines the temperature, pH, etc. of the copper structure 22 and first and second solutions.

Turning now to FIG. 6, the plate 30 is shown in perspective supporting the substrate 26 having copper structure 22 thereon. The system 20 provides for regulating the various parameters associated with etching copper structure 22 during the above described process.

Referring again to FIG. 4, the system 20 for etching a copper structure works as follows. Dispenser 35 initially deposits a first solution over the substrate 26. Subsequently, dispenser 35 deposits a second solution over the substrate 26. Temperature, pH, peroxide concentration, copper structure height, passivation layer thickness, and optional component concentrations are then maintained, raised, and/or lowered. Measuring system 50, processor 60, pH regulator 48, memory 70, and heaters 40 control the parameters.

The following examples illustrate the present invention. Unless otherwise indicated in the following examples and elsewhere in the specification and claims, all parts and percentages are by weight, all temperatures are in degrees Centigrade, and pressure is at or near atmospheric pressure.

EXAMPLE 1

A first solution is prepared by mixing 4.4% by weight of carbamide peroxide, 0.5% by weight ascorbic acid, 2% by weight SURFONIC® POA-L64 F108 block polymer surfactant from Huntsman, 4.2% by weight ammonium sulfate, 0.1% by weight potassium hydroxide, and 88% by weight water, and maintaining a pH between 4 and 5 and a temperature of 25° C. A second solution is prepared by mixing 1.07% by weight oxalic acid, 0.15% by weight tetramethylammonium hydroxide, and 98.8% by weight water, and maintaining a pH between 2 and 3 and a temperature of 40° C.

The first solution is contacted with the wafer for 30 seconds. The wafer is rinsed with water again. The second solution is contacted with the wafer for 45 seconds. The wafer is rinsed with water and spun dry.

EXAMPLE 2

A first solution is prepared by mixing 9.4% by weight of hydrogen peroxide, 0.1% by weight malic acid, 5% by weight PLURONIC® F108 water soluble polymer surfactant from BASF, 4.6% by weight ammonium sulfate, 0.1% by weight ammonium hydroxide, and 80.8% by weight water, and maintaining a pH of 4.85 and a temperature of 20° C. A second solution is prepared by mixing 1% by weight citric acid, 0.02% by weight EDTA, 0.1% by weight KATHON™ CG II biocide from Rohm & Haas, 0.1% by weight ammonium hydroxide, and 98.8% by weight water, and maintaining a pH of 2.65 and a temperature of 50° C.

A wafer having a copper structure thereon is rinsed with water. The first solution is contacted with the wafer for 60 seconds. The wafer is rinsed with water again. The second solution is contacted with the wafer for 60 seconds. The wafer is rinsed with water. The second solution is contacted with wafer again for cleaning purposes for 180 seconds. The wafer is rinsed with water and spun dry.

EXAMPLE 3

A first solution is prepared by mixing 7% by weight of di-t-butyl peroxide, 2% by weight of hydrogen peroxide, 0.5% by weight maleic acid, 4.6% by weight ammonium sulfate, 0.1% by weight ammonium hydroxide, and 85.8% by weight water, and maintaining a pH between 4 and 5 and a temperature of 15° C. A second solution is prepared by mixing 1% by weight citric acid, 0.12% by weight glutaric acid, 0.1% by weight tetramethylammonium hydroxide, and 98.8% by weight water, and maintaining a pH between 2 and 3 and a temperature of 60° C.

A wafer having a copper structure thereon is rinsed with water. The first solution is contacted with the wafer for 40 seconds. The wafer is rinsed with water again. The second solution is contacted with the wafer for 65 seconds. The wafer is rinsed with water and spun dry.

EXAMPLE 4

A first solution is prepared by mixing 9.4% by weight of hydrogen peroxide, 0.1% by weight malic acid, 5% by weight PLURONIC® F108 water soluble polymer surfactant from BASF, 4.6% by weight ammonium sulfate, 0.1% by weight ammonium hydroxide, and 80.8% by weight water, and maintaining a pH of 4.85 and a temperature of 25° C. A second solution is prepared by mixing 1% by weight citric acid, 0.02% by weight itaconic acid, 3% by weight SURFONIC® POA-L64 F108 block polymer surfactant from Huntsman, 0.1% by weight KATHON™ CG II biocide from Rohm & Haas, 0.1% by weight ammonium hydroxide, and 95.8% by weight water, and maintaining a pH between 2 and 3 and a temperature of 45° C.

The first solution is contacted with the wafer for 55 seconds. The wafer is rinsed with water. The second solution is contacted with the wafer for 80 seconds. The wafer is rinsed with water. The second solution is contacted with wafer again for cleaning purposes for 80 seconds. The wafer is rinsed with water and spun dry.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of etching a copper containing material, comprising:
   contacting the copper containing material comprising at least about 10% by weight copper with a first solution to convert at least a portion of the copper containing material to a passivating film, the first solution comprising a peroxide compound, a first organic acid, and water and having a pH from about 2 to about 6; and
   contacting the passivating film with a second solution to remove the passivating film, the second solution comprising a second organic acid and water.

2. The method of claim 1,
   the peroxide compound is selected from the group consisting of one or more of barium peroxide, benzoyl peroxide, carbamide peroxide, cumene hydroperoxide, di-t-butyl peroxide, hydrogen peroxide, potassium peroxide, and sodium peroxide; and
   the first organic acid and the second organic acid independently selected from the group consisting of one or more of formic acid, acetic acid, propionic acid, butyric acid, pentanoic acid, hexanoic acid, heptanoic acid, octanoic acid, dichloroacetic acid, trichloroacetic acid, trifluoroacetic acid, perfluoroacetic acid, perfluorooctanoic acid, oxalic acid, malonic acid, succinic acid, fumaric acid, glutaric acid, itaconic acid, ethylenediaminetetraacetic acid, citric acid, ascorbic acid, maleic acid, malic acid, dimethylphosphoric acid, dimethylphosphinic acid, methanesulfonic acid, trifluoromethanesulfonic acid, ethanesulfonic acid, 1-pentanesulfonic acid, 1-hexanesulfonic acid, 1-heptanesulfonic acid, benzenesulfonic acid, benzenedisulfonic acid, tolulenesulfonic acid, naphthalenesulfonic acid, tropolone, benzoic acid, and picric acid.

3. The method of claim 1, wherein the first solution comprises from about 1% to about 50% by weight the peroxide compound, from about 0.001% to about 10% by weight of the first organic acid, and from about 30% to about 98% by weight of water.

4. The method of claim 1, wherein the first solution further comprises at least one of a surfactant, a pH adjuster, and an ionic salt.

5. The method of claim 1, wherein the second solution comprises from about 0.001% to about 10% by weight of the second organic acid and from about 50% to about 99.9% by weight of water.

6. The method of claim 1, wherein the second solution further comprises at least one of a surfactant, a pH adjuster, and a biocide.

7. The method of claim 1, wherein the first solution has a pH from about 3 to about 5.5 and the second solution has a pH from about 1 to about 6.

8. The method of claim 1, wherein the first solution has a temperature from about 5° C. to about 50° C. the second solution has a temperature from about 20° C. to about 90° C.

9. The method of claim 1, wherein the passivating film comprises copper oxide.

10. A method of etching a copper structure, comprising:
contacting the copper structure comprising at least about 25% by weight copper on a wafer with a first solution to convert at least a portion of the copper structure to a passivating film, the first solution comprising a peroxide compound, a first organic acid, and water and having a pH from about 2 to about 6;
contacting the passivating film with a second solution to remove the passivating film, the second solution comprising a second organic acid and water, the second solution having a lower pH and a higher temperature than the pH and temperature of the first solution; and
rinsing the wafer with water to provide an etched copper structure.

11. The method of claim 10, wherein the first solution comprises from about 2% to about 40% by weight the peroxide compound, from about 0.01% to about 5% by weight of the first organic acid, from about 40% to about 95% by weight of water, from about 0.01% to about 20% by weight of a surfactant, and from about 0.001% to about 5% by weight of a pH adjuster.

12. The method of claim 10, wherein the second solution comprises from about 0.01% to about 5% by weight of the second organic acid, from about 70% to about 99.5% by weight of water, from about 0.001% to about 5% by weight of a biocide, and from about 0.001% to about 5% by weight of a pH adjuster.

13. The method of claim 10, wherein the second solution comprises at least two organic acids.

14. The method of claim 10, wherein the first solution contacts the copper structure for a time from about 1 second to about 200 minutes and the second solution contacts the passivating film for a time from about 1 second to about 200 minutes.

15. The method of claim 10, wherein the first solution further comprises a nonionic water soluble polymer surfactant.

16. The method of claim 10, wherein the etched copper structure has an $R_{tm}$ of about 50 Å or less.

17. A method of etching a copper containing material, comprising:
contacting the copper containing material with a first solution to convert at least a portion of the copper containing material to a passivation layer, the first solution comprising a peroxide compound, a first organic acid, and water and having a pH from about 2 to about 6;
contacting the passivation layer with a second solution to remove the passivation layer, the second solution comprising a second organic acid and water;
and simultaneously
monitoring the formation and removal of the passivation layer using a scatterometry system by generating a signature associated with forming and removing the layer, comparing the signature to a signature library to determine layer depth, and terminating forming and removing the passivation layer when a desired depth is attained.

18. The method of claim 17, wherein generating the signature associated with forming and removing the passivation layer comprises directing a beam of incident light at the passivation layer, collecting light reflected from the passivation layer, and transforming the reflected light into the signature.

19. The method of claim 17, wherein a closed loop feedback control system for terminating the formation and removal of the passivation layer according to the determined depth comprises feeding information related to passivation layer depth via the closed loop feedback control system to a first and second solution controller, wherein the first and second solution controller is connected to a trained neural network to facilitate termination of the formation and removal of the passivation layer.

20. The method of claim 17, wherein the scatterometry system further compares the signature to a signature library to determine passivation layer profile, and terminates forming and removing the passivation layer when a desired passivation layer profile is attained.

* * * * *